US009385338B2

(12) United States Patent
Wehlus et al.

(10) Patent No.: US 9,385,338 B2
(45) Date of Patent: Jul. 5, 2016

(54) ORGANIC LIGHT-EMITTING COMPONENT

(71) Applicant: OSRAM Opto Semiconductors GmbH, Regensburg (DE)

(72) Inventors: Thomas Wehlus, Lappersdorf (DE); Arndt Jaeger, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/383,511

(22) PCT Filed: Mar. 1, 2013

(86) PCT No.: PCT/EP2013/054207
§ 371 (c)(1),
(2) Date: Sep. 5, 2014

(87) PCT Pub. No.: WO2013/131830
PCT Pub. Date: Sep. 12, 2013

(65) Prior Publication Data

US 2015/0048337 A1 Feb. 19, 2015

(30) Foreign Application Priority Data

Mar. 6, 2012 (DE) ........................ 10 2012 203 466

(51) Int. Cl.
*H01L 51/00* (2006.01)
*H01L 51/50* (2006.01)
*H01L 51/52* (2006.01)

(52) U.S. Cl.
CPC .......... *H01L 51/504* (2013.01); *H01L 51/5044* (2013.01); *H01L 51/5218* (2013.01);
(Continued)

(58) Field of Classification Search
CPC ... H01L 27/15; H01L 51/504; H01L 51/5265; H01L 51/5278
USPC ................................................ 257/40, 88, 99
See application file for complete search history.

(56) References Cited

U.S. PATENT DOCUMENTS 8,466,453 B2 6/2013 Wellmann et al.
8,786,177 B2 7/2014 Ono (Continued)

FOREIGN PATENT DOCUMENTS

DE 102007052181 A1 4/2009
EP 2068380 B1 8/2011

(Continued)

OTHER PUBLICATIONS

"OLED+ Materials for Display & Lighting Applications," Novaled, 8 pages, http://www.novaled.com/fileadmin/user_upload/pdf/Novaled_Material_19.pdf. (Original date unknown, retrieved Sep. 5, 2014).

*Primary Examiner* — Jamie C Niesz
(74) *Attorney, Agent, or Firm* — Slater Matsil, LLP

(57) ABSTRACT

An organic light-emitting component includes a first light-emitting layer sequence, which is designed to emit light in a first wavelength range during the operation of the component. A second light-emitting layer sequence is designed to emit light in a second wavelength range during the operation of the component. A charge carrier generating layer sequence is designed to output charge carriers to the first light-emitting layer sequence and to the second light-emitting layer sequence during the operation of the component. The first wavelength range differs from the second wavelength range. The charge carrier generating layer sequence is arranged between the first light-emitting layer sequence and the second light-emitting layer sequence in a stacking direction of the organic light-emitting component.

10 Claims, 2 Drawing Sheets

(52) U.S. Cl.
CPC ........ *H01L51/5221* (2013.01); *H01L 51/5265* (2013.01); *H01L 51/5271* (2013.01); *H01L 2251/558* (2013.01)

(56) References Cited

U.S. PATENT DOCUMENTS

2006/0244370 A1* 11/2006 Tyan .................. H01L 51/5278 313/506
2007/0024168 A1 2/2007 Nishimura et al.
2007/0181887 A1* 8/2007 Kijima ................ H01L 51/5278 257/79
2009/0091258 A1 4/2009 Heuser et al.
2011/0133226 A1* 6/2011 Lee .................... H01L 51/5278 257/89
2011/0180786 A1 7/2011 Xia et al.

FOREIGN PATENT DOCUMENTS

| | | | |
|---|---|---|---|
| EP | 2485568 | A1 | 8/2012 |
| WO | 2010062643 | A1 | 6/2010 |
| WO | 2011027657 | A1 | 3/2011 |
| WO | 2011040294 | A1 | 4/2011 |

* cited by examiner

ORGANIC LIGHT-EMITTING COMPONENT

This patent application is a national phase filing under section 371 of PCT/EP2013/054207, filed Mar. 1, 2013, which claims the priority of German patent application 10 2012 203 466.8, filed Mar. 6, 2012, each of which is incorporated herein by reference in its entirety.

TECHNICAL FIELD

An organic light-emitting component is specified.

SUMMARY OF THE INVENTION

Embodiments of the invention specify an organic light-emitting component in which the useable optical power is increased compared with conventional organic light-emitting components. Further embodiments specify an organic light-emitting component in which the outlay for production is reduced compared with conventional organic light-emitting components.

In accordance with at least one embodiment of the organic light-emitting component, the component comprises a first light-emitting layer sequence, which is intended, in particular designed, to emit light in a first wavelength range during the operation of the component. The first light-emitting layer sequence in this case has at least one layer.

By way of example, a light-emitting layer sequence described here comprises at least one electroluminescent layer in which charge carriers—electrons and holes—recombine with generation of light. Here and hereinafter, light denotes in particular electromagnetic radiation in an ultraviolet to infrared spectral range, and in particular in a visible spectral range. Suitable materials for the at least one or the plurality of electroluminescent layers include, in particular, materials which exhibit emission of radiation on account of fluorescence or phosphorescence, for example, polyfluorene, polythiophene or polyphenylene or derivatives, compounds, mixtures or copolymers thereof. Alternatively or additionally, the at least one or the plurality of electroluminescent layers can also comprise small-molecule materials which can generate light by means of fluorescence or phosphorescence.

The first light-emitting layer sequence generates light in a first wavelength range during the operation of the component. The light in the first wavelength range can be mixed light, but in particular is light having a specific color. By way of example, the first light-emitting layer sequence is designed to emit blue light during operation. For this purpose, the first light-emitting layer comprises a fluorescent blue emitter, in particular.

In accordance with at least one embodiment of the organic light-emitting component, the component comprises a second light-emitting layer sequence, which is designed to emit light in a second wavelength range during the operation of the component. The second light-emitting layer sequence, too, comprises at least one layer. The light in the second wavelength range can be color-pure light, but in particular is mixed light. By way of example, the second light-emitting layer sequence is designed to emit red-green mixed light during operation. For this purpose, the second light-emitting layer sequence comprises phosphorescent red and green emitters, in particular.

In accordance with at least one embodiment, the organic light-emitting component comprises a charge carrier generating layer sequence ("charge generation layer", CGL), which is designed to output charge carriers to the first light-emitting layer sequence and to the second light-emitting layer sequence during the operation of the component. In particular, light-emitting layer sequences adjacent to one another can be electrically connected to one another by the charge carrier generating layer sequence, wherein charge carriers can be injected into the light-emitting layer sequences by the charge carrier generating layer sequence.

In accordance with at least one embodiment of the organic light-emitting component, the first wavelength range differs from the second wavelength range. That is to say that the different light-emitting layer sequences generate light of different colors, for example, during the operation of the component. In this case, in particular, the mechanism of light generation can be different in different light-emitting layer sequences. By way of example, the light generation takes place by fluorescence in the first light-emitting layer sequence, and by phosphorescence in the second light-emitting layer sequence.

Furthermore, it is possible for the two wavelength ranges to differ, but to comprise in each case light of the same color. That is to say that in each case light of the same color is then generated in the light-emitting layer sequences. The wavelength ranges can then overlap one another, but in particular are not coincident.

In accordance with at least one embodiment of the organic light-emitting component, the charge carrier generating layer sequence is arranged between the first light-emitting layer sequence and the second light-emitting layer sequence in a stacking direction of the organic light-emitting component. In this case, the stacking direction runs, for example, transversely or perpendicularly to the main extension direction of the layer sequences of the component. For example, the stacking direction runs transversely or perpendicularly to a light exit surface of the component.

The charge carrier generating layer sequence can be in direct contact with the adjacent light-emitting layer sequences.

In accordance with at least one embodiment of the organic light-emitting component, the charge carrier generating layer sequence has a thickness of at most 50 nm in the stacking direction. In particular, the thickness of the charge carrier generating layer sequence in the stacking direction is at most 30 nm, preferably at most 25 nm.

In accordance with at least one embodiment of the organic light-emitting component, a component includes the following. A first light-emitting layer sequence is designed to emit light in a first wavelength range during the operation of the component. A second light-emitting layer sequence is designed to emit light in a second wavelength range during the operation of the component. A charge carrier generating layer sequence is designed to output charge carriers to the first light-emitting layer sequence and to the second light-emitting layer sequence during the operation of the component. The first wavelength range differs from the second wavelength range. The charge carrier generating layer sequence is arranged between the first light-emitting layer sequence and the second light-emitting layer sequence in a stacking direction of the organic light-emitting component. The charge carrier generating layer sequence has a thickness of at most 50 nm.

An organic light-emitting component comprising such a thin charge carrier generating layer sequence is distinguished, inter alia, by saving of material during the production of the component. In this regard, the use of a thin charge carrier generating layer sequence having a thickness of 16 nm, for example, compared with a component comprising a thicker charge carrier generating layer sequence having a thickness of 160 nm, saves at least 85%, in particular 90%, of the used material in the region of the charge carrier generating layer sequence.

Since, for such a thin charge carrier generating layer sequence, less material has to be vapor-deposited, for example, during the production of the component, the production time for producing the component is significantly reduced. The component can therefore be produced cost-effectively with reduced outlay.

In accordance with at least one embodiment of the organic light-emitting component, the light-emitting layer sequences are arranged between two at least partly reflective electrodes, which form an optical microcavity of the organic light-emitting component. By way of example, the component can comprise a metallic, light-nontransmissive first electrode and a light-transmissive, for example, transparent, second electrode, through which the light generated in the component can emerge during the operation of the component. Furthermore, it is possible for the component to be a light-transmissive component comprising two light-transmissive electrodes each having a certain reflectivity, such that an optical microcavity is formed in this case as well.

The optical microcavity has, in particular, a plurality of amplification regions (also "maxima"). Light from a light-emitting layer sequence which is situated in an amplification region is amplified by positive interference, for example, in the amplification region. In this case, the position of the amplification region in the microcavity is dependent on the wavelength of the light. That is to say that the amplification region for white mixed light is not punctiform or linear, but rather has a specific extent and/or width.

In accordance with at least one embodiment of the organic light-emitting component, the first light-emitting layer sequence and the second light-emitting layer sequence are arranged in a first amplification region of the optical microcavity. In this case, the first amplification region is that amplification region in which the amplification is the highest for the light from the first and second wavelength ranges. If the component comprises, for example, a light-nontransmissive first electrode and a second light-transmissive electrode, then the amplification region which occurs first in the stacking direction from the light-nontransmissive first electrode, for example, the cathode, to the second electrode is the first amplification region. In this case, by way of example, the first light-emitting layer sequence is arranged nearer to the first electrode than the second light-emitting layer sequence. The first wavelength range then comprises shorter wavelengths than the second wavelength range. It can thus be ensured that both light-emitting layer sequences are arranged in that region of the amplification region which is optimum for them.

In particular the particularly thin charge carrier generating layer sequence described here makes it possible to arrange two or more light-emitting layer sequences in the same amplification region. In other words, the particularly thin charge carrier generating layer sequence makes it possible to arrange, if possible, all light-emitting layer sequences of the component in the first amplification region, where the power maxima of the microcavity are the highest. That is to say that, including for the case where the component comprises more than two light-emitting layer sequences, said layers can be arranged in the first amplification region, that is to say in the greatest cavity maximum.

In accordance with at least one embodiment of the organic light-emitting component, exactly one charge carrier generating layer sequence is arranged between each pair of adjacent light-emitting layer sequences. In this case, each charge carrier generating layer sequence can, in particular, directly adjoin the two light-emitting layer sequences between which it is situated.

In particular, the charge carrier generating layer sequences of the component act as tunnel junctions between the light-emitting layer sequences stacked on one another.

In accordance with at least one embodiment of the organic light-emitting component, the first wavelength range comprises the spectral range of blue light. In this case, a not very efficient blue fluorescent emitter is arranged in the first amplification region.

In accordance with at least one embodiment of the organic light-emitting component, the second wavelength range comprises the spectral range of red-green mixed light. That is to say that, for example, efficient phosphorescent red and green emitters are likewise arranged in the first amplification region.

The combination of the two different types of emitter in the first amplification region makes it possible to realize an organic component which emits white light and which is distinguished by a high useable optical power and a good long-term stability.

In accordance with at least one embodiment of the organic light-emitting component, the first electrode is light-nontransmissive and the first light-emitting layer sequence is arranged nearer to the first electrode than the second light-emitting layer sequence is arranged relative to the first electrode. If the first light-emitting layer sequence is a layer sequence which emits in the blue spectral range, then it is possible in this way for this layer sequence to be arranged as near as possible to the cavity maximum for the electromagnetic radiation from the first wavelength range.

In accordance with at least one embodiment of the organic light-emitting component, the charge carrier generating layer sequence exclusively comprises layers which are formed with an undoped organic material and/or a metal. That is to say that, in this case, the charge carrier generating layers are realized without doped layers, that is to say without dopants in a matrix. By way of example, a p-side layer and an n-side layer can be vapor-deposited one above another as pure organic layers. A thin intermediate layer can be inserted between them. In terms of process engineering this has the advantage that emitter sources for a dopant can be dispensed with. Furthermore, it has been found that the charge carrier generating layer sequence can be made particularly thin in this way.

By way of example, a p-side layer of the charge carrier generating layer sequence can consist of HAT-CN or contain HAT-CN. An n-side layer of the charge carrier generating layer sequence can, for example, contain one of the following materials or consist of one of the following materials: NDN-26, NET-18, MgAg, LG-201.

BRIEF DESCRIPTION OF THE DRAWINGS

The organic light-emitting component described here is explained in greater detail below on the basis of exemplary embodiments and the associated figures.

In the exemplary embodiments and the figures, identical or identically acting constituent parts are provided in each case with the same reference signs. The illustrated elements should not be regarded as true to scale; rather, individual elements may be illustrated with an exaggerated size in order to afford a better understanding. In the following exemplary embodiments, components described here are shown in each case in the bottom emitter configuration. However, the components described here could also be embodied as top emitters or radiation-transmissive, in particular transparent, components.

DETAILED DESCRIPTION OF ILLUSTRATIVE EMBODIMENTS

Figure 1A:
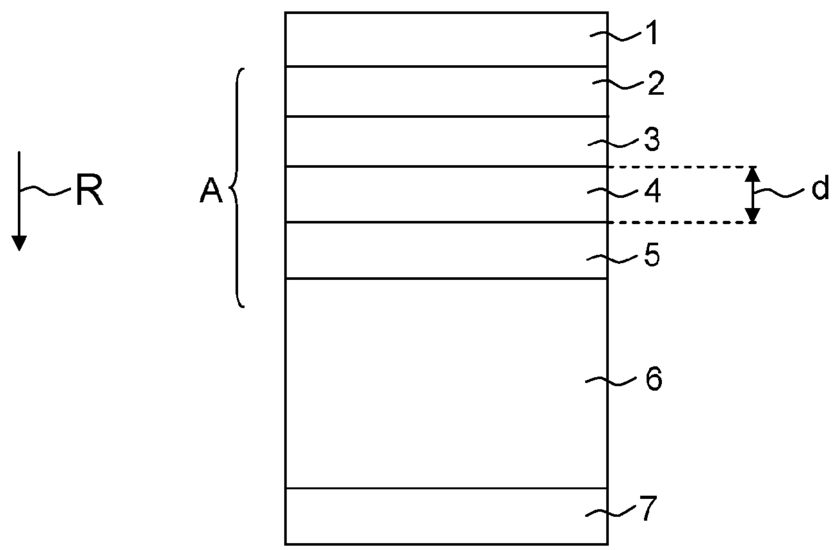
FIGS. 1A and 1B provide schematic sectional illustrations where one exemplary embodiment of an organic light-emitting component described here is explained in greater detail.

FIG. 1A shows a schematic sectional illustration of one exemplary embodiment of an organic light-emitting component described here. The component comprises a first electrode 1, which forms the cathode of the component in the present case. The first electrode 1 is embodied, for example, as light-nontransmissive, reflective. By way of example, the first electrode 1 consists of a metal such as aluminum and/or silver.

In the stacking direction R, the first electrode 1 is succeeded by an electron injection layer 2. By means of this layer, electrons are injected into the subsequent organic layers.

In the stacking direction R, the first electrode 1 is succeeded by a first light-emitting layer sequence 3. During the operation of the component, blue light, for example, is generated in the first light-emitting layer sequence 3. For this purpose, the first light-emitting layer sequence 3 comprises a fluorescent emitter material, for example.

In the stacking direction R, the first light-emitting layer sequence 3 is succeeded by the charge carrier generating layer sequence 4. This layer sequence has a thickness d of at most 50 nm, of approximately 20 nm in the present case, in the stacking direction R.

In the stacking direction R, the charge carrier generating layer sequence 4 is succeeded by a second light-emitting layer sequence 5. During the operation of the component, in this layer sequence red-green light, for example, is generated by a phosphorescent emitter material.

In the stacking direction R, the second light-emitting layer sequence 5 is succeeded by a hole injection layer 6. A second electrode 7 is arranged at that side of the hole injection layer 6 which faces away from the first electrode 1. The second electrode 7 is embodied, for example, as light-transmissive, transparent. For this purpose, the second electrode 7 can consist of a thin metal layer and/or a transparent conductive oxide.

On account of the small thickness of the charge carrier generating layer sequence 4, both light-emitting layer sequences 3, 5 can be arranged in the first amplification region A of the microcavity formed by the electrodes 1, 7.

Figure 1B:
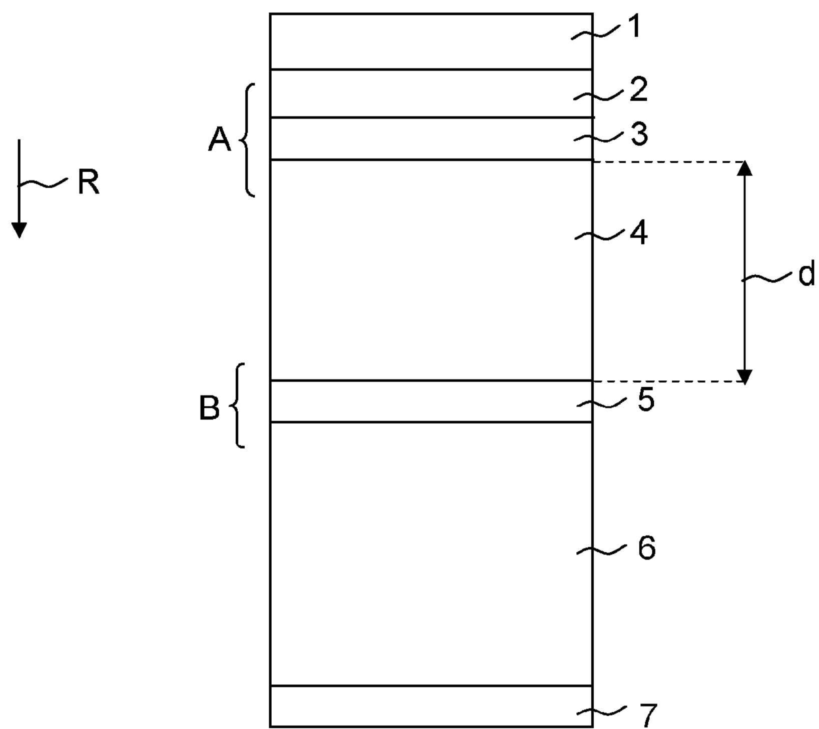
Figure 2:
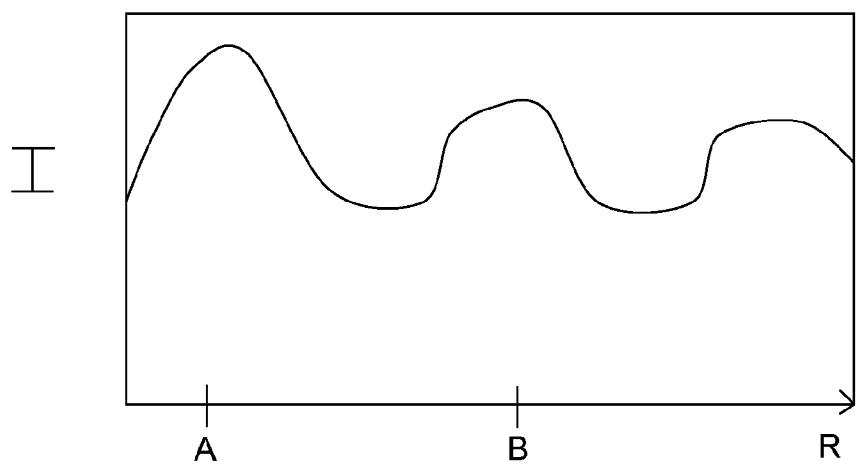
FIG. 2 provides a graphical plot where one exemplary embodiment of an organic light-emitting component described here is explained in greater detail.

FIG. 1B shows in comparison a component in which the charge carrier generating layer sequence 4 has a thickness d of 100 nm or more. Here, the second light-emitting layer sequence 5 has to be arranged in the second amplification region B, in which the amplification is lower than in the first amplification region A. This can also be gathered from the graphical plot in FIG. 2, which plots the amplification I in the stacking direction R.

Figure 3:
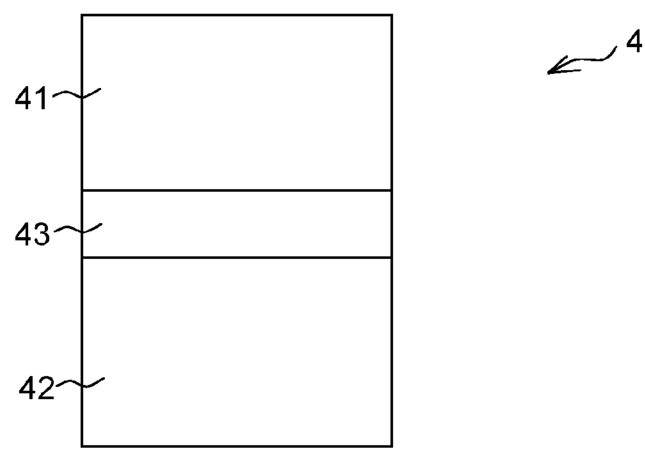
FIG. 3 provides schematic sectional illustration where charge carrier generating layer sequences for exemplary embodiments of organic light-emitting components described here are explained in greater detail.

The schematic sectional illustration in FIG. 3 shows a charge carrier generating layer sequence 4 described here. The charge carrier generating layer sequence 4 comprises a p-side layer 41, an n-side layer 42 and, optionally, an intermediate layer 43.

Undoped and/or doped organic materials and/or metals are used for the particularly thin charge carrier generating layer sequences 4 described here.

The following configurations of the charge carrier generating layer sequence 4 have proved to be advantageous in this case:

1. P-side layer 41 composed of HAT-CN, layer thickness 5 nm, intermediate layer 43 composed of VOPc, layer thickness 6 nm, n-side layer 42 composed of NDN-26, layer thickness 5 nm. This results in a thickness d of the charge carrier generating layer sequence 4 of 16 nm.
2. P-side layer 41 composed of HAT-CN, layer thickness 5 nm, intermediate layer 43 composed of VOPc, layer thickness 6 nm, n-side layer 42 composed of 32% NDN-26: NET-18, layer thickness 10 nm. This results in a thickness d of the charge carrier generating layer sequence 4 of 21 nm.
3. P-side layer 41 composed of HAT-CN, layer thickness 15 nm, n-side layer 42 composed of MgAg, layer thickness 3 nm. This results in a thickness d of the charge carrier generating layer sequence 4 of 18 nm. An intermediate layer 43 can be dispensed with here.

In this case, the charge carrier generating layer sequences 4 described are optimized with regard to the minimum operating voltage at the current density j=10 mA/cm$^2$. An operating voltage of 5.5 V results for the first example, an operating voltage of 5.8 V results for the second example, and an operating voltage of 6.8 V results for the third example. Furthermore, the component comprising a charge carrier generating layer in accordance with the third example exhibits a high voltage stability in the long-term test at a relatively high temperature of 85° C.

The invention described here is not restricted by the description on the basis of the exemplary embodiments. Rather, the invention encompasses any novel feature and also any combination of features, which in particular includes any combination of features in the patent claims. This holds true even if this feature or this combination itself is not explicitly specified in the patent claims or the exemplary embodiments.

The invention claimed is:

1. An organic light-emitting component comprising:

a first light-emitting layer sequence, which is designed to emit light in a first wavelength range during operation of the component, wherein the first wavelength range comprises the spectral range of blue light;

a second light-emitting layer sequence, which is designed to emit light in a second wavelength range during the operation of the component, wherein the second wavelength range comprises the spectral range of red-green mixed light, and wherein the organic light-emitting component is configured to emit white light;

a charge carrier generating layer sequence between the first light-emitting layer sequence and the second light-emitting layer sequence in a stacking direction of the organic light-emitting component, wherein the charge carrier generating layer sequence is designed to output charge carriers to the first light-emitting layer sequence and to the second light-emitting layer sequence during the operation of the component, wherein the charge carrier generation layer sequence exclusively comprises layers which are formed with an undoped organic material selected from the group consisting of HAT-CN, NDN-26, NET-18, LG-201, and wherein the charge carrier generating layer sequence has a thickness of, at most, 25 nm in the stacking direction; and two at least partly reflective electrodes that form an optical microcavity of the organic light-emitting component, wherein the first and second light-emitting layer sequences are arranged between the electrodes and wherein all light-emitting layer sequences are arranged in a first amplification region of the optical microcavity.

2. The organic light-emitting component according to claim 1, wherein exactly one charge carrier generating layer sequence is arranged between each pair of adjacent light-emitting layer sequences.

3. The organic light-emitting component according to claim 1, wherein each charge carrier generating layer sequence directly adjoins two light-emitting layer sequences.

4. The organic light-emitting component according to claim 1, wherein the charge carrier generating layer sequence acts as a tunnel barrier.

5. The organic light-emitting component according to claim 1, wherein a first of the electrodes is light-nontransmissive and the first light-emitting layer sequence is located nearer to the first of the electrodes than the second light-emitting layer sequence.

6. The organic light-emitting component according to claim 1, wherein the charge carrier generating layer sequence comprises a p-side layer that directly adjoins the first light-emitting layer sequence or the second light-emitting layer sequence, and wherein the p-side layer comprises HAT-CN.

7. The organic light-emitting component according to claim 1, wherein the charge carrier generating layer sequence comprises an n-side layer that directly adjoins the first light-emitting layer sequence or the second light-emitting layer sequence, wherein the n-side layer comprises a material selected from the group consisting of NDN-26, NET-18, and LG-201.

8. The organic light-emitting component according to claim 1, wherein the mechanism of light generation is different in different light-emitting layer sequences.

9. The organic light-emitting component according to claim 1, wherein light generation in the first light-emitting layer sequence takes place by fluorescence and light generation in the second light-emitting layer sequence takes place by phosphorescence.

10. The organic light-emitting component according to claim 1, wherein the charge carrier generating layer sequence comprises a p-side layer and an n-side layer, the p-side layer directly adjoining one of the two light-emitting layer sequences and the n-side layer directly adjoining the other of the two light-emitting layer sequences;

wherein the p-side layer comprises of HAT-CN; and wherein the n-side layer comprises a material selected from the group consisting of NDN-26, NET-18, and LG-201.

* * * * *